United States Patent
Tang et al.

[11] Patent Number: 5,550,066
[45] Date of Patent: Aug. 27, 1996

[54] METHOD OF FABRICATING A TFT-EL PIXEL

[75] Inventors: Ching W. Tang, Rochester; Biay C. Hseih, Pittsford, both of N.Y.

[73] Assignee: Eastman Kodak Company, Rochester, N.Y.

[21] Appl. No.: 355,940

[22] Filed: Dec. 14, 1994

[51] Int. Cl.$^6$ ................................................ H01L 21/86
[52] U.S. Cl. ...................... 437/40; 437/21; 437/59; 437/919; 148/DIG. 150
[58] Field of Search .................... 437/40 TF, 41 TF, 437/21, 913, 919, 54, 59; 148/DIG. 150

[56] References Cited

U.S. PATENT DOCUMENTS

| | | | |
|---|---|---|---|
| 3,807,037 | 4/1974 | Fischer | 437/59 |
| 3,885,196 | 5/1975 | Fischer | 345/80 |
| 3,913,090 | 10/1975 | Fischer | 345/80 |
| 4,006,383 | 2/1977 | Luo et al. | 313/505 |
| 4,042,854 | 8/1977 | Luo et al. | 313/505 |
| 4,356,429 | 10/1982 | Tang | 313/503 |
| 4,409,724 | 10/1983 | Tasch, Jr. et al. | 437/83 |
| 4,523,189 | 6/1985 | Takahara | 345/80 |
| 4,539,507 | 9/1985 | VanSlyke et al. | 313/504 |
| 4,602,192 | 7/1986 | Nomura et al. | 257/300 |
| 4,720,432 | 1/1988 | VanSlyke et al. | 313/504 |
| 4,950,950 | 8/1990 | Perry et al. | 313/504 |
| 5,047,360 | 9/1991 | Nicholas | 437/984 |
| 5,047,687 | 9/1991 | VanSlyke et al. | 313/504 |
| 5,059,861 | 10/1991 | Littman et al. | 313/504 |
| 5,061,569 | 10/1991 | VanSlyke et al. | 313/504 |
| 5,073,446 | 12/1991 | Scozzafava et al. | 313/504 |
| 5,150,006 | 9/1992 | VanSlyke et al. | 313/504 |
| 5,151,629 | 9/1992 | VanSlyke et al. | 313/504 |
| 5,235,195 | 8/1993 | Tran et al. | 437/21 |
| 5,276,380 | 1/1994 | Tang | 313/504 |
| 5,294,870 | 3/1994 | Tang et al. | 313/504 |

OTHER PUBLICATIONS

Suzuki et al, "The Fabrication of TFEL Displays Driven by a–Si TFTs;"SID 1992 Digest, pp. 344–347.
K. Ichikawa, et al, SID Digest, 226 (1989).
M. J. Powell, et al, Proceeding, International Display Conference, 63, 1987.
Sharp Corporation Technical Literature for model LQ424A01, 1989.
D. E. Castleberry, et al, SID Digest, 232 (1988).
S. Morozumi, Advances in Electronics and Electron Physics, Edited by P. W. Hawkes, vol. 77, Academic Press 1990.
A. G. Fischer, IEEE Trans. Electron Devices, 802 (1971).
T. P. Brody, et al, IEEE Trans. Electron Devices, 22, 739 (1975).
C. W. Tang, et al, Appl. Phys. Lett., 51, 913 (1987).
C. W. Tang, et al., Appl. Phys., 65, 3610 (1989).

*Primary Examiner*—Tom Thomas
*Assistant Examiner*—Michael Trinh
*Attorney, Agent, or Firm*—Raymond L. Owens

[57] ABSTRACT

A method of making a 4-terminal active matrix electroluminescent device that utilizes an organic material as the electroluminescent medium is described. In this method, thin film transistors are formed from polycrystalline silicon at a temperature sufficiently low such that a low temperature, silica-based glass can be used as the substrate.

10 Claims, 5 Drawing Sheets

METHOD OF FABRICATING A TFT-EL PIXEL

CROSS REFERENCE TO RELATED APPLICATIONS

Reference is made to commonly assigned U.S. Ser. No. 08/355,742 entitled "TFT-EL Display Panel Using Organic Electroluminescent Media" by Tang et al and U.S. Ser. No. 08/355,786 entitled "An Electroluminescent Device Having an Organic Electroluminescent Layer" by Tang et al, both filed concurrently herewith, the disclosures of which are incorporated herein.

FIELD OF THE INVENTION

The present invention relates to a process for making a 4-terminal active matrix thin-film-transistor electroluminescent device that employs organic material as the electroluminescent media.

INTRODUCTION

Rapid advances in flat-panel display (FPD) technologies have made high quality large-area, full-color, high-resolution displays possible. These displays have enabled novel applications in electronic products such as lap top computers and pocket-TVs. Among these FPD technologies, liquid crystal display (LCD) has emerged as the display of choice in the marketplace. It also sets the technological standard against which other FPD technologies are compared. Examples of LCD panels include: (1) 14", 16-color LCD panel for work stations (IBM and Toshiba, 1989) (see K. Ichikawa, S. Suzuki, H. Matino, T. Aoki, T. Higuchi and Y. Oano, SID Digest, 226 (1989)), (2) 6", full-color LCD-TV (Phillips, 1987) (see M. J. Powell, J. A. Chapman, A. G. Knapp, I. D. French, J. R. Hughes, A. D. Pearson, M. Allinson, M. J. Edwards, R. A. Ford, M. C. Hemmings, O. F. Hill, D. H. Nicholls and N. K. Wright, Proceeding, International Display Conference, 63, 1987), (3) 4" full-color LCD TV (model LQ424A01, Sharp, 1989) (see Sharp Corporation Technical Literature for model LQ424A01), and (4) 1 megapixel colored TFT-LCD (General Electric) (see D. E. Castleberry and G. E. Possin, SID Digest, 232 (1988)). All references, including patents and publications, are incorporated herein as if reproduced in full below.

A common feature in these LCD panels is the use of thin-film-transistors (TFT) in an active-addressing scheme, which relaxes the limitations in direct-addressing (see S. Morozumi, Advances in Electronics and Electron Physics, edited by P. W. Hawkes, Vol. 77, Academic Press 1990). The success of LCD technology is in large part due to the rapid progress in the fabrication of large-area TFT (primarily amorphous silicon TFT). The almost ideal match between TFT switching characteristics and electrooptic LCD display elements also plays a key role.

A major drawback of TFT-LCD panels is they require bright backlighting. This is because the transmission factor of the TFT-LCD is poor, particularly for colored panels. Typically the transmission factor is about 2–3 percent (see S. Morozumi, Advances in Electronics and, Electron Physics, edited by P. W. Hawkes, Vol. 77, Academic Press, 1990). Power consumption for backlighted TFT-LCD panels is considerable and adversely affects portable display applications requiring battery operation.

The need for backlighting also impairs miniaturization of the flat panel. For example, depth of the panel must be increased to accommodate the backlight unit. Using a typical tubular cold-cathode lamp, the additional depth is about ¾ to 1 inch. Backlight also adds extra weight to the FPD.

An ideal solution to the foregoing limitation would be a low power emissive display that eliminates the need for backlighting. A particularly attractive candidate is thin-film-transistor-electroluminescent (TFT-EL) displays. In TFT-EL displays, the individual pixels can be addressed to emit light and auxiliary backlighting is not required. A TFT-EL scheme was proposed by Fischer in 1971 (see A. G. Fischer, IEEE Trans. Electron Devices, 802 (1971)). In Fischer's scheme powdered ZnS is used as the EL medium.

In 1975, a successful prototype TFT-EL panel (6") was reportedly made by Brody et al. using ZnS as the EL element and CdSe as the TFT material (see T. P. Brody, F. C. Luo, A. P. Szepesi and D. H. Davies, IEEE Trans. Electron Devices, 22, 739 (1975)). Because ZnS-EL required a high drive voltage of more than a hundred volts, the switching CdSe TFT element had to be designed to handle such a high voltage swing. The reliability of the high-voltage TFT then became suspect. Ultimately, ZnS-based TFT-EL failed to successfully compete with TFT-LCD. U.S. Patents describing TFT-EL technology include: U.S. Pat. Nos. 3,807,037; 3,885,196; 3,913,090; 4,006,383; 4,042,854; 4,523,189; and 4,602,192.

Recently, organic EL materials have been devised. These materials suggest themselves as candidates for display media in TFT-EL devices (see C. W. Tang and S. A. VanSlyke, Appl. Phys. Lett., 51,913 (1987), C. W. Tang, S. A. VanSlyke and C. H. Chen, J. Appl. Phys., 65, 3610 (1989)). Organic EL media have two important advantages: they are highly efficient; and they have low voltage requirements. The latter characteristic distinguishes over other thin-film emissive devices. Disclosures of TFT-EL devices in which EL is an organic material include: U.S. Pat. Nos. 5,073,446; 5,047,687; 5,059,861; 5,294,870; 5,151,629; 5,276,380; 5,061,569; 4,720,432; 4,539,507; 5,150,006; 4,950,950; and 4,356,429.

The particular properties of organic EL material that make it ideal for TFT are summarized as follows:

1) Low-voltage drive. Typically, the organic EL cell requires a voltage in the range of 4 to 10 volts depending on the light output level and the cell impedance. The voltage required to produce a brightness of about 20 fL is about 5V. This low voltage is highly attractive for a TFT-EL panel, as the need for the high-voltage TFT is eliminated. Furthermore, the organic EL cell can be driven by DC or AC. As a result the driver circuity is less complicated and less expensive.

2) High efficiency. The luminous efficiency of the organic EL cell is as high as 4 lumens per watt. The current density to drive the EL cell to produce a brightness of 20 fL is about 1 $mA/cm^2$. Assuming a 100% duty excitation, the power needed to drive a 400 $cm^2$ full-page panel is only about 2.0 watts. The power need will certainly meet the portability criteria of the flat panel display.

3) Low temperature fabrication. Organic EL devices can be fabricated at about room temperature. This is a significant advantage compared with inorganic emissive devices, which require high-temperature (>300° C.) processing. The high-temperature processes required to make inorganic EL devices can be incompatible with the TFT.

The simplest drive scheme for an organic EL panel is to have the organic display medium sandwiched between two sets of orthogonal electrodes (rows and columns). Thus, in this two-terminal scheme, the EL element serves both the display and switching functions. The diode-like nonlinear current-voltage characteristic of the organic EL element should, in principle, permit a high degree of multiplexing in this mode of addressing. However, there are several major factors limiting usefulness of the two-terminal scheme in connection with organic EL:

1) Lack of memory. The rise and decay time of the organic EL is very fast, on the order of microseconds, and it does not have an intrinsic memory. Thus, using the direct addressing method, the EL elements in a selected row would have to be driven to produce an instantaneous brightness proportional to the number of scan rows in the panel. Depending on the size of the panel, this instantaneous brightness may be difficult to achieve. For example, consider a panel of 1000 scan rows operating at a frame rate of 1/60 seconds. The allowable dwell time per row is 17 µs. In order to obtain a time-averaged brightness of, for example, 20 Fl, the instantaneous brightness during the row dwell time would have to be a thousand times higher, i.e., 20,000 Fl, an extreme brightness that can only be obtained by operating the organic EL cell at a high current density of about 1 A/cm$^2$ and a voltage of about 15–20 volts. The long-term reliability of a cell operating under these extreme drive conditions is doubtful.

2) Uniformity. The current demanded by the EL elements is supplied via the row and column buses. Because of the instantaneous high current, the IR potential drops along these buses are not insignificant compared with the EL drive voltage. Since the brightness-voltage characteristic of the EL is nonlinear, any variation in the potential along the buses will result in a non-uniform light output.

Consider a panel with 1000 rows by 1000 columns with a pixel pitch of 200µ×200µ and an active/actual area ratio of 0.5. Assuming the column electrode is indium tin oxide (ITO) of 10 ohms/square sheet ($\Omega/\square$) resistance, the resistance of the entire ITO bus line is at least 10,000 ohms. The IR drop along this bus line for an instantaneous pixel current of 800 µA (2 A/cm$^2$) is more than 8 volts. Unless a constant current source is implemented in the drive scheme, such a large potential drop along the ITO bus will cause unacceptable non-uniform light emission in the panel. In any case, the resistive power loss in the bus is wasteful. A similar analysis can be performed for the row electrode bus that has the additional burden of carrying the total current delivered to the entire row of pixels during the dwell time, i.e., 0.8 A for the 1000-column panel. Assuming a 1 µm thick aluminum bus bar of sheet resistance about 0.028 ohms/square the resultant IR drop is about 11 volts, which is also unacceptable.

3) Electrode patterning. One set of the orthogonal electrodes, the anode-indium tin oxide, can be patterned by a conventional photolithographic method. The patterning of the other set of electrodes however, presents a major difficulty peculiar to the organic EL device. The cathode should be made of a metal having a work function lower than 4 eV, and preferably magnesium alloyed with another metal such as silver or aluminum (see Tang et al., U.S. Pat. No. 4,885,432). The magnesium-based alloy cathode deposited on top of the organic layers cannot be easily patterned by any conventional means involving photoresists. The process of applying the photoresist from an organic solvent on the EL cell deleteriously affects the soluble organic layer underneath the magnesium-based alloy layer. This causes delamination of the organic layers from the substrate.

Another difficulty is the extreme sensitivity of the cathode to moisture. Thus, even if the photoresist can be successfully applied and developed without perturbing the organic layers of the EL cell, the process of etching the magnesium-based alloy cathode in aqueous acidic solution is likely to oxidize the cathode and create dark spots.

SUMMARY OF THE INVENTION

The present invention provides an active matrix 4-terminal TFT-EL device in which organic material is used as the EL medium. The device comprises two TFTs, a storage capacitor and a light emitting organic EL pad arranged on a substrate. The EL pad is electrically connected to the drain of the second TFT. The first TFT is electrically connected to the gate electrode of the second TFT which in turn is electrically connected to the capacitor so that following an excitation signal the second TFT is able to supply a nearly constant current to the EL pad between signals. The TFT-EL devices of the present invention are typically pixels that are formed into a flat panel display, preferably a display in which the EL cathode is a continuous layer across all of the pixels.

The TFT-organic EL device of the present invention are formed in a multi-step process as described below:

A first thin-film-transistor (TFT1) is disposed over the top surface of the substrate. TFT1 comprises a source electrode, a drain electrode, a gate dielectric, and a gate electrode; and the gate electrode comprises a portion of a gate bus. The source electrode of TFT1 is electrically connected to a source bus.

A second thin-film-transistor (TFT2) is also disposed over the top surface of the substrate, and TFT2 also comprises a source electrode, a drain electrode, a gate dielectric, and a gate electrode. The gate electrode of TFT2 is electrically connected to the drain electrode of the first thin-film-transistor.

A storage capacitor is also disposed over the top surface of the substrate. During operation, this capacitor is charged from an excitation signal source through TFT1, and discharges during the dwell time to provide nearly constant potential to the gate electrode of TFT2.

An anode layer is electrically connected to the drain electrode of TFT2. In typical applications where light is emitted through the substrate, the display is a transparent material such as indium tin oxide.

A dielectric passivation layer is deposited over at least the source of TFT1, and preferably over the entire surface of the device. The dielectric passivation layer is etched to provide an opening over the display anode.

An organic electroluminescent layer is positioned directly on the top surface of the anode layer. Subsequently, a cathode layer is deposited directly on the top surface of the organic electroluminescent layer.

In preferred embodiments, the TFT-EL device of the present invention is made by a method using low pressure and plasma enhanced chemical vapor deposition combined with low temperature (i.e. less than 600° C.) crystallization and annealing steps, hydrogen passivation and conventional patterning techniques.

The thin-film-transistors are preferably formed simultaneously by a multi-step process involving:

the deposition of silicon that is patterned into polycrystalline silicon islands;

chemical vapor deposition of a silicon dioxide gate electrode; and deposition of another polycrystalline silicon layer which is patterned to form a self-aligned gate electrode so that after ion-implantation a source, drain, and gate electrode are formed on each thin-film-transistor.

The construction of pixels having thin-film-transistors composed of polycrystalline silicon and silicon dioxide provides improvements in device performance, stability, reproducibility, and process efficiency over other TFTs. In comparison, TFTs composed of CdSe and amorphous silicon suffer from low mobility and threshold drift effect.

There are several important advantages in the actual panel construction and drive arrangement of a TFT-organic EL device of the present invention:

1) Since both the organic EL pad and the cathode are continuous layers, the pixel resolution is defined only by the feature size of the TFT and the associated display ITO pad and is independent of the organic component or the cathode of the EL cell.

2) The cathode is continuous and common to all pixels. It requires no patterning for pixel definition. The difficulty of patterning the cathode in the two-terminal scheme is therefore eliminated.

3) The number of scanning rows is no longer limited by the short row dwell time in a frame period, as the addressing and excitation signals are decoupled. Each scan row is operated at close to 100% duty factor. High resolution can be obtained since a large number of scan rows can be incorporated into a display panel while maintaining uniform intensity.

4) The reliability of the organic EL element is enhanced since it operates at a low current density (1 mA/cm$^2$) and voltage (5V) in a 100% duty factor.

5) The IR potential drops along the buses are insignificant because of the use of a common cathode and the low current density required to drive the EL elements. Therefore the panel uniformity is not significantly affected by the size of the panel.

DETAILED DESCRIPTION OF THE INVENTION

Figure 1:
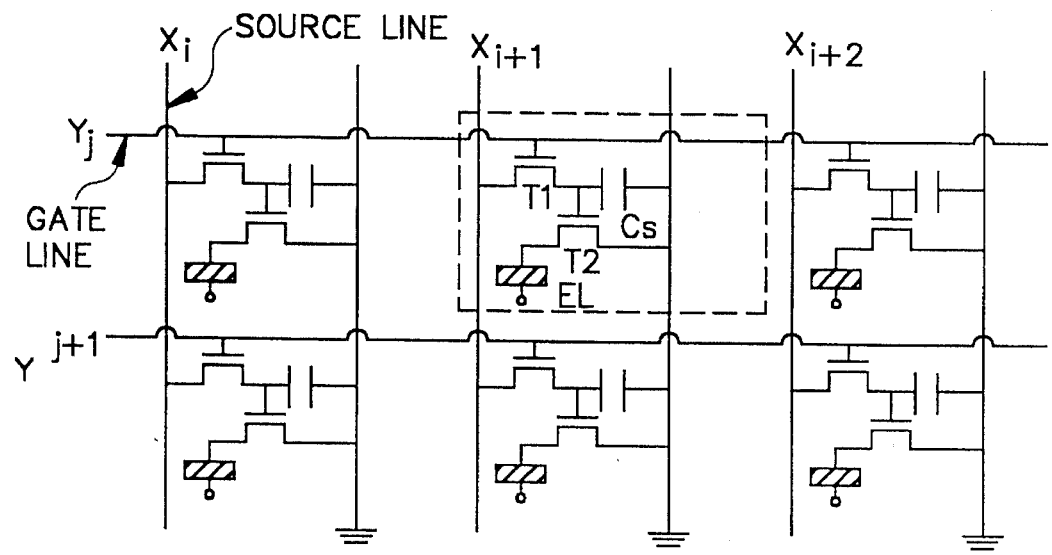
FIG. 1 is a schematic diagram of an active matrix 4-terminal TFT-EL device. T1 and T2 are thin-film-transistors, Cs is a capacitor and EL is an electroluminescent layer.

FIG. 1 shows the schematic of an active matrix 4-terminal TFT-EL display device. Each pixel element includes two TFTs, a storage capacitor and an EL element. The major feature of the 4-terminal scheme is the ability to decouple the addressing signal from the EL excitation signal. The EL element is selected via the logic TFT (T1) and the excitation power to the EL element is controlled by the power TFT (T2). The storage capacitor enables the excitation power to an addressed EL element to stay on once it is selected. Thus, the circuit provides a memory that allows the EL element to operate at a duty cycle close to 100%, regardless of the time allotted for addressing.

Figure 2:
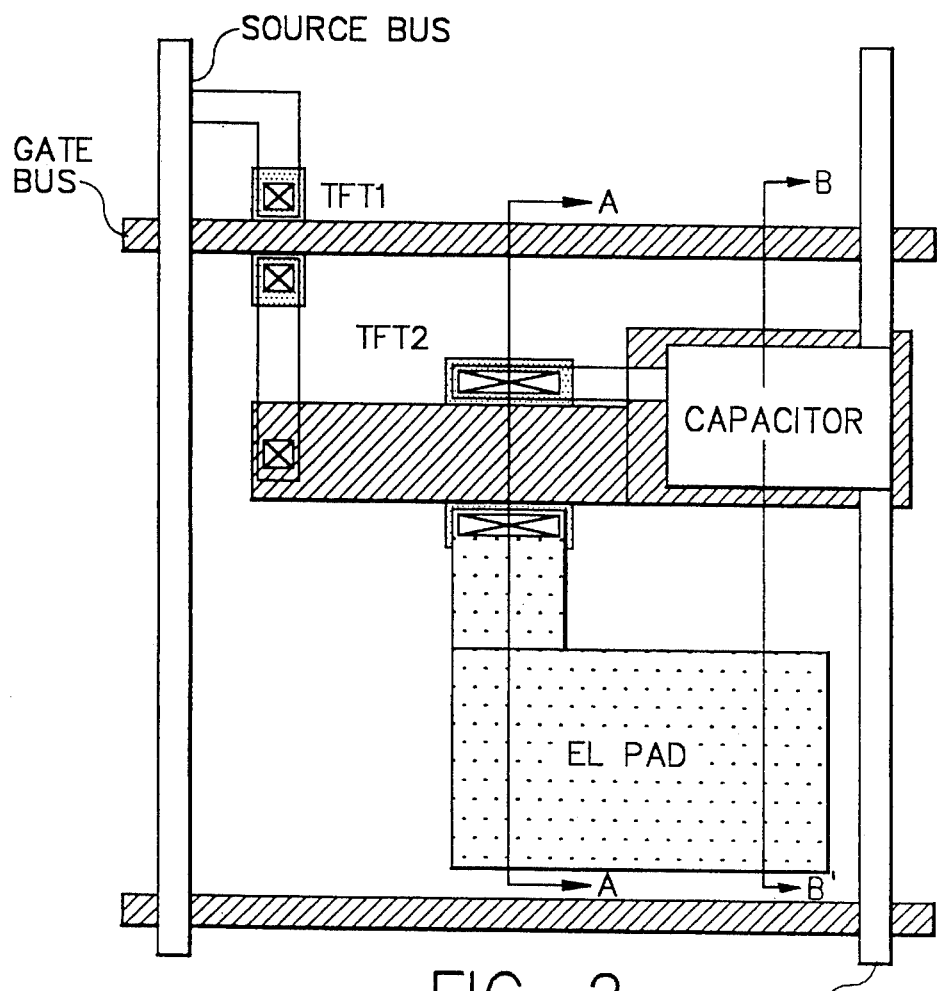
FIG. 2 is a diagrammatic plan view of the 4-terminal TFT-EL device of the present invention.
Figure 3:
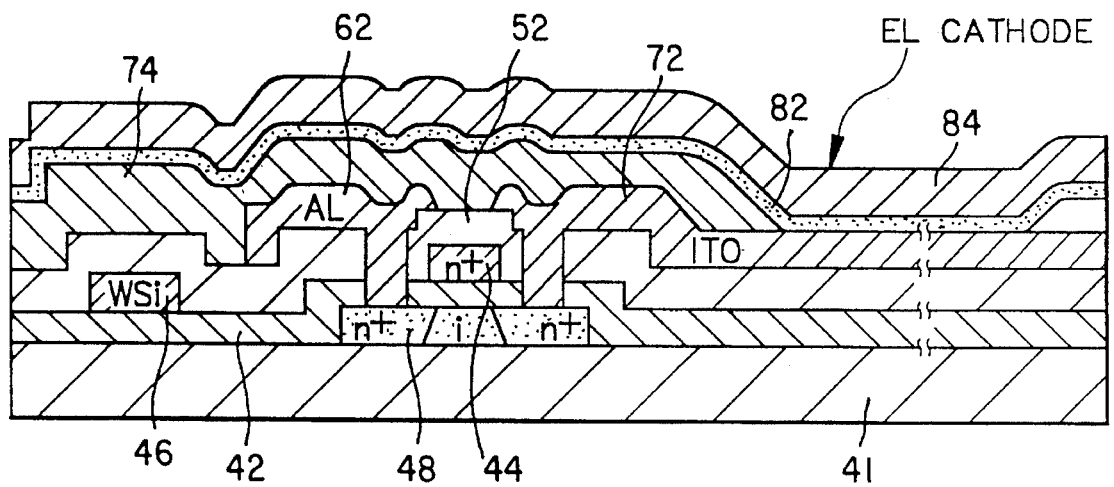
FIG. 3 is a cross-sectional view taken along the line A-A' in FIG. 2.
Figure 4:
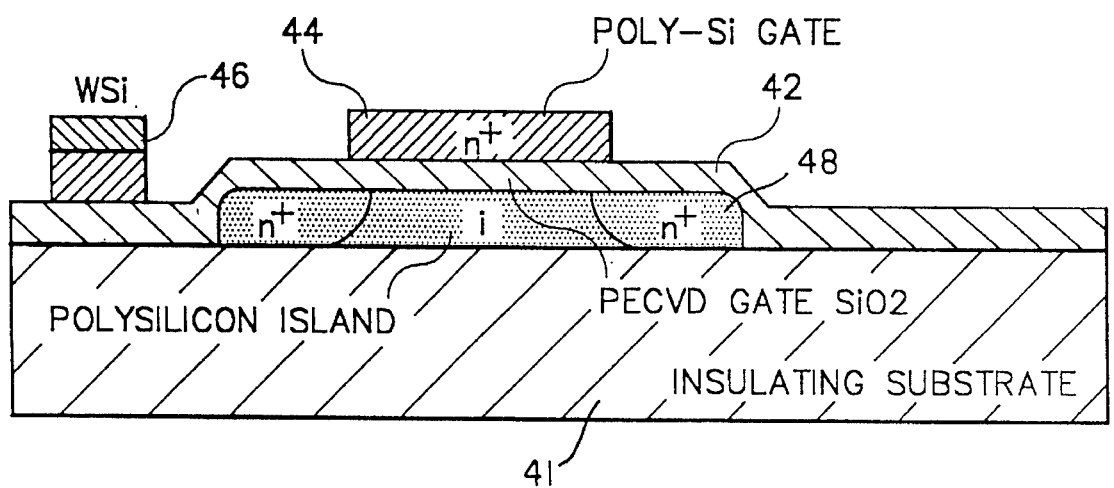
FIG. 4 is a cross-sectional view taken along the line A-A', illustrating the process of forming a self-aligned TFT structure for ion implantation.
Figure 5:
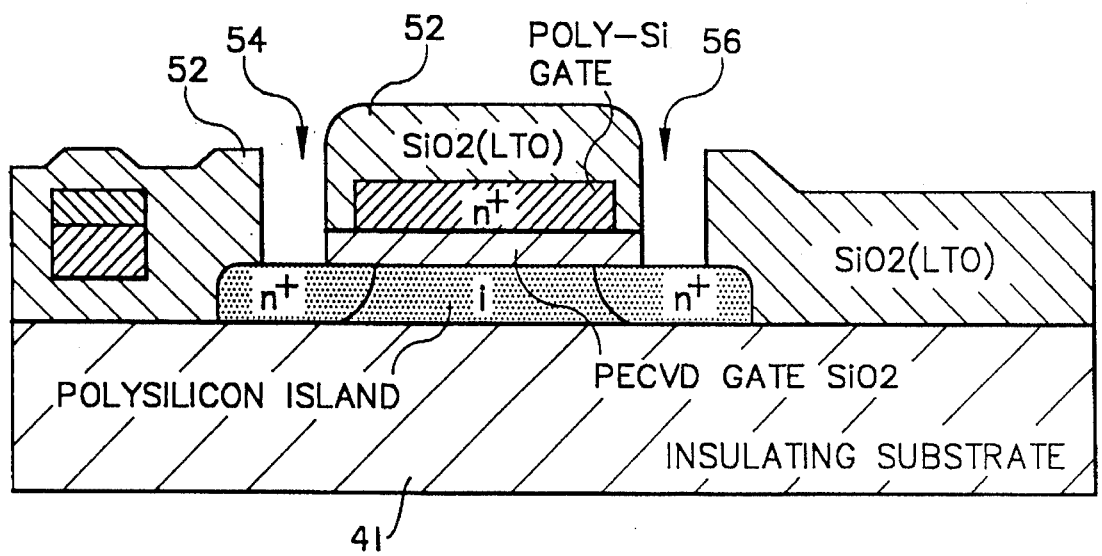
FIG. 5 is a cross-sectional view taken along the line A-A', illustrating the processing steps of depositing a passivation oxide layer and opening contact cuts to the source and drain regions of the thin-film-transistor.

The construction of the electroluminescent device of the present invention is illustrated in FIGS. 2 and 3. The substrate of this device is an insulating and preferably transparent material such as quartz or a low temperature glass. The term transparent, as it is used in the present disclosure, means that the component transmits sufficient light for practical use in a display device. For example, components transmitting 50% or more of light in a desired frequency range are considered transparent. The term low temperature glass refers to glasses that melt or warp at temperatures above about 600° C.

In the TFT-EL device illustrated in FIG. 2, TFT1 is the logic transistor with the source bus (column electrode) as the data line and the gate bus (row electrode) as the gate line. TFT2 is the EL power transistor in series with the EL element. The gate line of TFT2 is connected to the drain of TFT1. The storage capacitor is in series with TFT1. The anode of the EL element is connected to the drain of TFT2.

Figure 9:
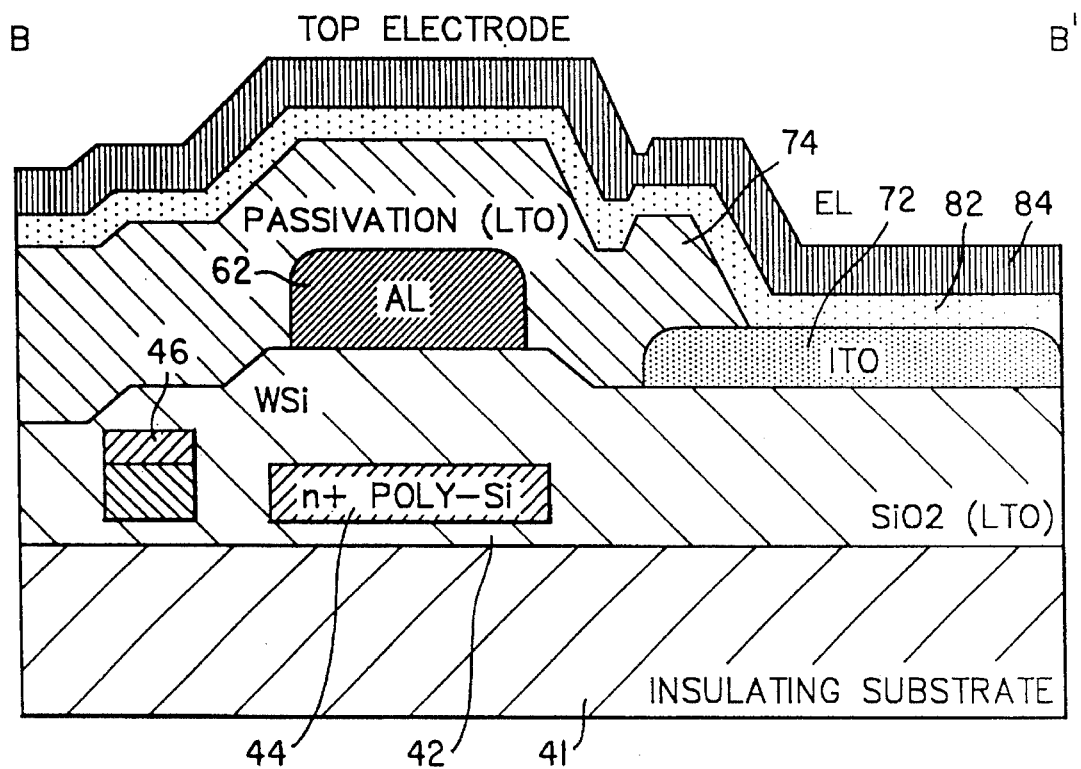
FIG. 9 is a cross-sectional view taken along line B-B' in FIG. 2.

The construction of the TFT-EL of FIG. 2 is shown in cross-sectional view in FIGS. 3–9. The cross-sectional views shown in FIGS. 3–8 are taken along section line A-A' in FIG. 2. The cross-sectional view in FIG. 9 is taken along line B-B' in FIG. 2.

In the first processing step, a polysilicon layer is deposited over a transparent, insulating substrate and the polysilicon layer is patterned into an island (see FIG. 4) by photolithography. The substrate may be crystalline material such as quartz, but preferably is a less expensive material such as low temperature glass. When a glass substrate is utilized, it is preferable that the entire fabrication of the TFT-EL be carried out at low processing temperatures to prevent melting or warping of the glass and to prevent out-diffusion of dopants into the active region. Thus, for glass substrates, all fabrication steps should be conducted below 1000° C. and preferably below 600° C.

Next, an insulating gate material 42 is deposited over the polysilicon island and over the surface of the insulating substrate. Insulating material is preferably silicon dioxide that is deposited by a chemical vapor deposition (CVD) technique such as plasma enhanced CVD (PECVD) or low pressure CVD (LPCVD). Preferably, the gate oxide insulating layer is about 1000Å in thickness.

In the next step, a layer of silicon 44 is deposited over the gate insulator layer and patterned by photolithography over the polysilicon island such that after ion implantation, source and drain regions are formed in the polysilicon island. The gate electrode material is preferably polysilicon formed from amorphous silicon. Ion implantation is conducted with N-type dopants, preferably arsenic. The polysilicon gate electrode also serves as the bottom electrode of the capacitor (see FIG. 9).

In a preferred embodiment of the present invention, the thin film transistors do not utilize a double gate structure. Thus manufacturing is made less complex and less expensive.

A gate bus 46 is applied and patterned on the insulating layer. The gate bus is preferably a metal silicide such as tungsten silicide ($WSi_2$).

In the next step, an insulating layer, preferably silicon dioxide, 52 is applied over the entire surface of the device.

Figure 6:
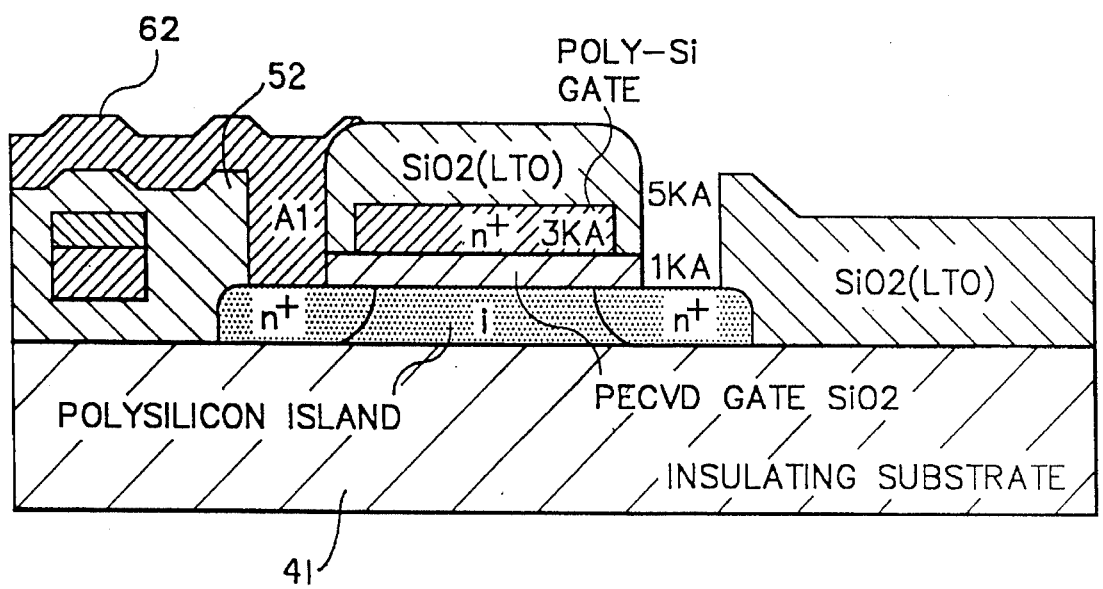
FIG. 6 is a cross-sectional view taken along line A-A', illustrating deposition of an aluminum electrode.
Figure 7:
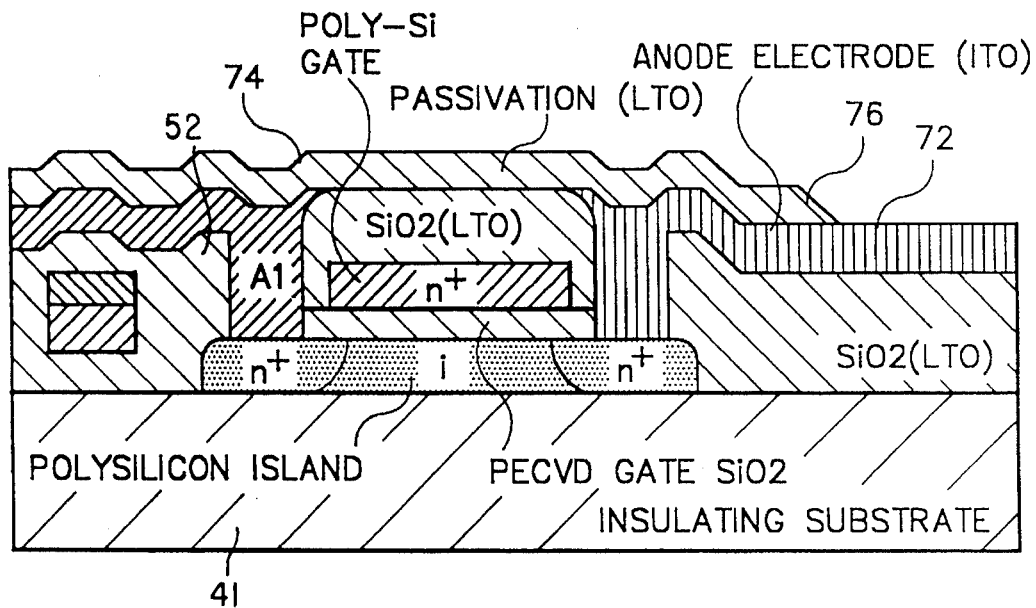
FIG. 7 is a cross-sectional view taken along line A-A', illustrating deposition of the display anode and a passivation layer that has been partially etched from the surface of the display anode.
Figure 8:
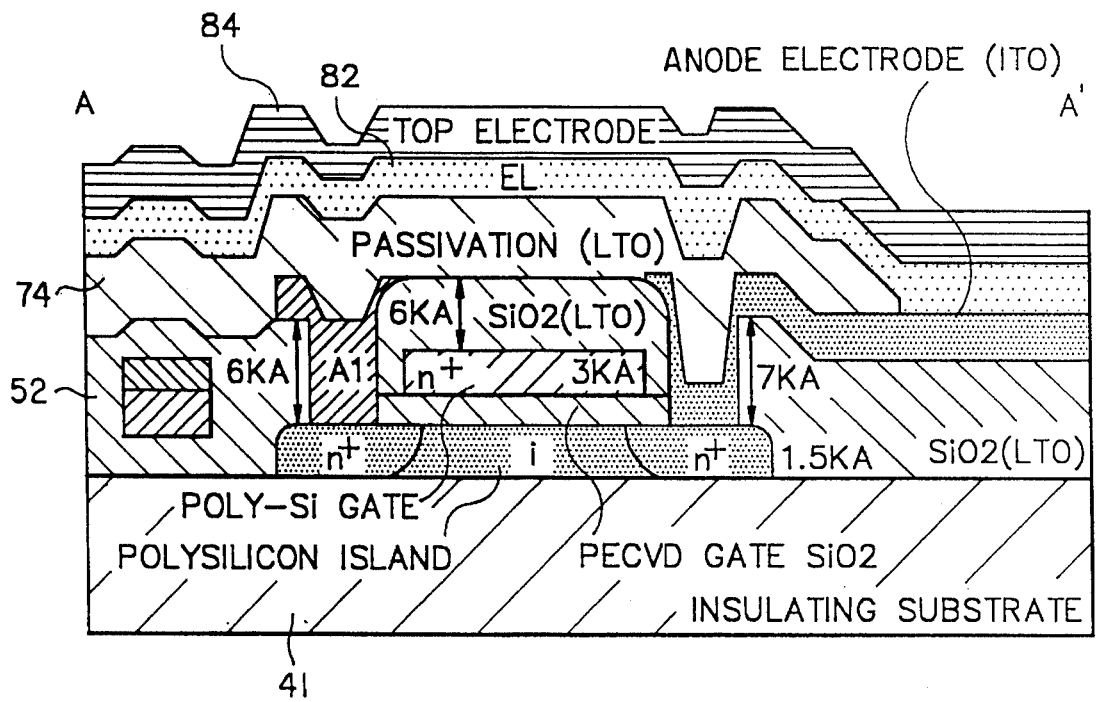
FIG. 8 is a cross-sectional view taken along line A-A', illustrating the steps of depositing an electroluminescent layer and a cathode.

Contact holes 54 and 56 are cut in the second insulating layer (see FIG. 5) and electrode materials are applied to form contacts with the thin-film-transistors (see FIGS. 6 and 7). The electrode material 62 attached to the source region of TFT2 also forms the top electrode of the capacitor (see FIG. 9). A source bus and ground bus are also formed over the second insulating layer (see FIG. 2). In contact with the drain region of TFT2 is a transparent electrode material 72, preferably ITO, which serves as the anode for the organic electroluminescent material.

In the next step, a passivating layer 74 of an insulating material, preferably silicon dioxide, is deposited over the surface of the device. The passivation layer is etched from the ITO anode leaving a tapered edge 76 which serves to improve the adhesion of the subsequently applied organic electroluminescent layer. A tapered edge is necessary to produce reliable devices because the present invention utilizes relatively thin organic EL layers, typically 150 to 200 nm thick. The passivation layer is typically about 0.5 to about 1 micron thick. Thus, if the edge of the passivation layer forms a perpendicular or sharp angle with respect to the anode layer, defects are likely to occur due to discontinuities in the organic EL layer. To prevent defects the passivation layer should have a tapered edge. Preferably the passivation layer is tapered at an angle of 10 to 30 degrees with respect to the anode layer.

The organic electroluminescent layer 82 is then deposited over the passivation layer and the EL anode layer. The materials of the organic EL devices of this invention can take any of the forms of conventional organic EL devices, such as those of Scozzafava EPA 349,265 (1990); Tang U.S. Pat. No. 4,356,429; VanSlyke et al. U.S. Pat. No. 4,539,507; VanSlyke et al. U.S. Pat. No. 4,720,432; Tang et al. U.S. Pat. No. 4,769,292; Tang et al. U.S. Pat. No. 4,885,211; Perry et al. U.S. Pat. No. 4,950,950; Littman et al. U.S. Pat. No. 5,059,861; VanSlyke U.S. Pat. No. 5,047,687; Scozzafava et al. U.S. Pat. No. 5,073,446; VanSlyke et al. U.S. Pat. No. 5,059,862; VanSlyke et al. U.S. Pat. No. 5,061,617; VanSlyke U.S. Pat. No. 5,151,629; Tang et al. U.S. Pat. No. 5,294,869; and Tang et al. U.S. Pat. No. 5,294,870, the disclosures of which are incorporated by reference. The EL layer is comprised of an organic hole injecting and transporting zone in contact with the anode, and an electron injecting and transporting zone forming a junction with the organic hole injecting and transporting zone. The hole injecting and transporting zone can be formed of a single material or multiple materials, and comprises a hole injecting layer in contact with the anode and a contiguous hole transporting layer interposed between the hole injecting layer and the electron injecting and transporting zone. Similarly, the electron injecting and transporting zone can be formed of a single material or multiple materials, and comprises an electron injecting layer in contact with the cathode and a contiguous electron transporting layer that is interposed between the electron injecting layer and the hole injecting and transporting zone. Recombination of the holes and electrons, and luminescence, occurs within the electron injecting and transporting zone adjacent the junction of the electron injecting and transporting zone and the hole injecting and transporting zone. The components making up the organic EL layer are typically deposited by vapor deposition, but may also be deposited by other conventional techniques.

In a preferred embodiment the organic material comprising the hole injecting layer has the general formula:

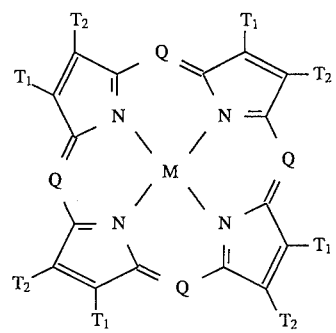

wherein:

Q is N or C(R)

M is a metal, metal oxide or metal halide

R is hydrogen, alkyl, aralkyl, aryl or alkaryl, and $T_1$ and $T_2$ represent hydrogen or together complete an unsaturated six membered ring that can include substituents such as alkyl or halogen. Preferred alkyl moieties contain from about 1 to 6 carbon atoms while phenyl constitutes a preferred aryl moiety.

In a preferred embodiment the hole transporting layer is an aromatic tertiary amine. A preferred subclass of aromatic tertiary amines include tetraaryldiamines having the formula:

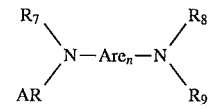

wherein

Are is an arylene group, n is an integer from 1 to 4, and

Ar, $R_7$, $R_8$ and $R_9$ are independently selected aryl groups.

In a preferred embodiment, the luminescent, electron injecting and transporting zone contains a metal oxinoid compound. A preferred example of a metal oxinoid compound has the general formula:

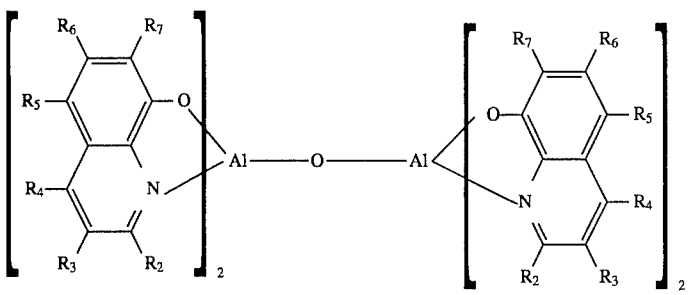

wherein $R_1$–$R_7$ represent substitutional possibilities. In another preferred embodiment, the metal oxinoid compound has the formula:

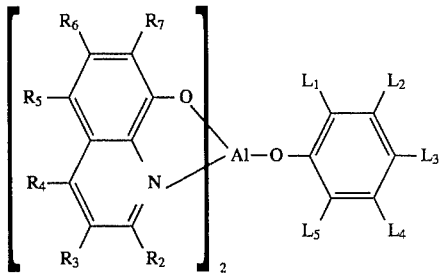

wherein $R_2$–$R_7$ are as defined above and $L_1$–$L_5$ collectively contain twelve or fewer carbon atoms and each independently represent hydrogen or hydrocarbon groups of from 1 to 12 carbon atoms, provided that $L_1$ and $L_2$ together or $L_2$ and $L_3$ together can form a fused benzo ring. In another preferred embodiment, the metal oxinoid compound has the formula:

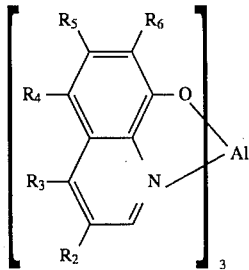

wherein $R_2$–$R_6$ represent hydrogen or other substitutional possibilities.

The foregoing examples merely represent some preferred organic materials used in the electroluminescent layer. They are not intended to limit the scope of the invention, which is directed to organic electroluminescent layers generally. As can be seen from the foregoing examples, the organic EL material includes coordination compounds having organic ligands. The TFT-EL device of the present invention does not include purely inorganic materials such as ZnS.

In the next processing step, the EL cathode 84 is deposited over the surface of the device. The EL cathode may be any electronically conducting material, however it is preferable that the EL cathode be made of a material having a work function of less than 4 eV (see Tang et al. U.S. Pat. No. 4,885,211). Low work function metals are preferred for the cathode since they readily release electrons into the electron transporting layer. The lowest work function metals are the alkali metals; however, their instability in air render their use impractical in some situations. The cathode material is typically deposited by physical vapor deposition, but other suitable deposition techniques are applicable. A particularly desirable material for the EL cathode has been found to be a 10:1 (atomic ratio) magnesium:silver alloy. Preferably, the cathode is applied as a continuous layer over the entire surface of the display panel. In another embodiment, the EL cathode is a bilayer composed of a lower layer of a low work function metal adjacent to the organic electron injecting and transporting zone and, overlying the low work function metal, a protecting layer that protects the low work function metal from oxygen and humidity. Optionally, a passivation layer may be applied over the EL cathode layer.

Typically, the anode material is transparent and the cathode material opaque so that light is transmitted through the anode material. However, in an alternative embodiment, light is emitted through the cathode rather than the anode. In this case the cathode must be light transmissive and the anode may be opaque. A practical balance light transmission and technical conductance is typically in the thickness range of 5–25 nm.

A preferred method of making a thin-film-transistor according to the present invention is described below. In a first step, an amorphous silicon film of 2000±20Å thickness is deposited at 550° C. in an LPCVD system with silane as the reactant gas at a process pressure of 1023 mTorr. This is followed by a low temperature anneal at 550° C. for 72 hours in vacuum to crystallize the amorphous silicon film into a polycrystalline film. Then a polysilicon island is formed by etching with a mixture of $SF_6$ and Freon 12 in a plasma reactor. Onto the polysilicon island active layer is deposited a 1000±20Å PECVD $SiO_2$ gate dielectric layer. The gate dielectric layer is deposited from a 5/4 ratio of $N_2O/SiH_4$ in a plasma reactor at a pressure of 0.8 Torr with a power level of 200W and a frequency of 450 KHz at 350° C. for 18 minutes.

In the next step an amorphous silicon layer is deposited over the PECVD gate insulating layer and converted to polycrystalline silicon using the same conditions as described above for the first step. A photoresist is applied and the second polysilicon layer is etched to form a self-aligned structure for the subsequent ion implantation step. The second polysilicon layer is preferably about 3000Å thick.

Ion implantation is conducted by doping with arsenic at 120 KeV at a dose of $2 \times 10^{15}/cm^2$ to simultaneously dope the source, drain and gate regions. Dopant activation is carried out at 600° C. for two hours in a nitrogen atmosphere.

In the next step, a 5000Å thick silicon dioxide layer is deposited by conventional low temperature methods. Aluminum contacts are formed by a physical vapor deposition and sintered in forming gas (10% $H_2$, 90% $N_2$) for thirty minutes at 400° C.

Finally, hydrogen passivation of the thin-film-transistor is carried out in an electron cyclotron resonance reactor (ECR).

ECR hydrogen plasma exposure is conducted at a pressure of $1.2 \times 10^{-4}$ Torr with a microwave power level of 900W and a frequency of 3.5 GHz. Hydrogen passivation is performed for fifteen minutes at a substrate temperature of 300° C. This procedure results in a thin-film-transistor device having a low threshold voltage, a high effective carrier mobility and an excellent on/off ratio.

As an example of characteristics of the present invention, consider the drive requirements for the following TFT-EL panel:

| | |
|---|---|
| Number of rows | = 1000 |
| Number of columns | = 1000 |
| Pixel dimension | = 200 μm × 200 μm |
| EL fill-factor | = 50% |
| frame time | = 17 ms |
| row dwell time | = 17 μs |
| Avg brightness | = 20 fL |
| EL pixel current | = 0.8 μA |
| Duty cycle | = 100% |
| EL power source | = 10 v rms |

These drive requirements are met by the following specifications for the TFTs and the storage capacitor:

| TFT1 | |
|---|---|
| Gate voltage | = 10 V |
| Source voltage | = 10 V |
| On-current | = 2 μA |
| Off-current | = $10^{-11}$ A TFT2 |
| Gate voltage | = 10 V |
| Source voltage | = 5 V |
| On-current | = 2 × EL pixel current |
| | = 1.6 μA |
| Off-current | = 1 nA |
| Storage capacitor: | |
| Size | = 1 pf |

The on-current requirement for TFT1 is such that it is large enough to charge up the storage capacitor during the row dwell time (17 μs) to an adequate voltage (10V) in order to turn on the TFF2. The off-current requirement for TFT1 is such that it is small enough that the voltage drop on the capacitor (and TFT2 gate) during the frame period (17 ms) is less than 2%.

The on-current requirement for TFT2 is (designed to be) about 2 times the EL pixel current, 1.6 μA. This factor of two allows for adequate drive current to compensate for the gradual degradation of the organic EL element with operation. The off-current of TFT2 affects the contrast of the panel. An off-current of 1 nA should provide an on/off contrast ratio greater than 500 between a lit and an unlit EL element. The actual contrast ratio of the panel may be lower, depending on the ambient lighting factor.

For a full page panel of 400 cm² the power required by the EL elements alone is about 4 watts.

$$\text{Power} = 400 \text{ cm}^2 \times 10 \text{ v} \times 0.001 \text{ A/cm}^2$$
$$= 4 \text{ watts}$$

This power consumption excludes the power consumed by the TFTs. Since TFT2 is in series with the EL element, any source-drain voltage drop across TFT2 will result in substantial power loss in the TFT2. Assuming a source-drain voltage of 5 volts, the total power loss on TFT2 is 2 watts. The power consumption for TFT1 is estimated to be no greater than 1 watt for the 1000×1000 panel. The power needed for the row (gate) drivers is negligible, on the order of a few tens of milliwatts, and the power for the column (source) drivers is on the order of 0.5 watt (see S. Morozumi, Advances in Electronics and Electron Physics, edited by P. W. Hawkes, Vol. 77, Academic Press, 1990). Thus, the total power consumption for a full page TFT-EL panel is about 7 watts. Realistically, the average power consumption would be much less since the EL screen is not 100% on in average usage.

The TFT-EL panel of the present invention has two important advantages in terms of power requirements over TFT-LCD panels. First, the TFT-EL power need is relatively independent of whether the panel is monochrome or multi-color, provided that the color materials have a similar luminescent efficiency. In contrast, the TFT-LCD colored panel requires a much higher power than the monochrome panel because the transmission factor is greatly reduced in the colored panel by the color filter arrays. Second, the LCD backlight has to stay on regardless of the screen usage factor. In contrast, the TFT-EL power consumption is highly dependent on this usage factor. The average power consumption is much less since less than 100% of the EL screen is emitting at any given time in typical applications.

The invention has been described in detail with particular reference to preferred embodiments thereof, but it will be understood that variations and modifications can be effected within the spirit and scope of the invention.

Parts List 42 gate material
44 silicon layer
46 gate bus
52 insulating layer
54 contact holes
56 contact holes
62 electrode material
72 electrode material
74 passivating layer
76 tapered edge
82 EL layer
84 EL cathode

We claim:

1. A method of fabricating a TFT-EL pixel comprising the steps of:

a) providing an insulating substrate having top and bottom surfaces, depositing a layer of silicon on the top surface of said substrate and patterning said layer to form a first and a second polycrystalline silicon island;

b) depositing a first dielectric layer over the top surface of said substrate and over said first and second polycrystalline islands to form a gate dielectric layer;

c) depositing a first strip of material over said first polycrystalline silicon island, and depositing a second strip of material over said second polycrystalline silicon island;

d) depositing a layer for the bottom electrode of a capacitor;

e) ion-implanting into said polycrystalline silicon islands and said strips of material to form source and drain regions and a doped gate electrode; thus forming first and second thin-film-transistors;

f) depositing a second dielectric layer covering said first dielectric layer, said strips of material, and said bottom layer of a capacitor;

g) etching through said first and second dielectric layers to form source and drain contact holes and depositing conducting material into said source and drain contact holes;

h) depositing a conductive layer that forms the top electrode of said capacitor;

i) depositing a display anode layer electrically connected to said drain of said second thin-film-transistor; said anode layer disposed on said second dielectric layer;

j) depositing a third dielectric layer over the surface of the article resulting from step i;

k) etching a hole through said third dielectric layer to expose said display anode layer;

l) depositing an organic electroluminescent layer over said display anode layer; and depositing a cathode layer over said organic layer.

2. The method of claim 1 additionally comprising the steps of depositing a source bus electrically connected to said source region of said first thin-film-transistor; and depositing a ground bus electrically connected to said capacitor.

3. The method of claim 1 wherein said first strip of material is selected from the group consisting of silicon and a metal silicide, and said second strip of material is silicon.

4. The method of claim 1 wherein said step of etching through said third dielectric layer creates a tapered edge on said third dielectric layer.

5. The method of claim 1 wherein said polycrystalline silicon islands are formed on a low temperature glass substrate by the chemical vapor deposition of an amorphous silicon layer and a low temperature anneal at less than 600° C., followed by photo lithographically forming islands in a plasma etch.

6. The method of claim 5 wherein said second strip of material and said bottom electrode of said capacitor are formed of a common polysilicon layer that is doped during said ion-implanting step with a dopant selected from the group consisting of Sb, As, P and N.

7. The method of claim 6 wherein said ion-implanting step is followed by dopant activation conducted at about 600° C.

8. The method of claim 6 wherein said thin-film-transistors are subjected to a hydrogen passivation step in an electron cyclotron resonance plasma system at about 300° C.

9. The method of claim 1 wherein said organic electroluminescent layer comprises an electron transporting and injecting zone and a hole injecting and transporting zone wherein both zones are deposited by vacuum evaporation.

10. The method of claim 1 wherein said organic electroluminescent layer is about 150 to 200 nm thick.

* * * * *